(12) United States Patent
Nakano et al.

(10) Patent No.: US 10,868,382 B2
(45) Date of Patent: Dec. 15, 2020

(54) PRINTED CIRCUIT BOARD AND IMAGE FORMING APPARATUS HAVING PRINTED CIRCUIT BOARD

(71) Applicant: CANON KABUSHIKI KAISHA, Tokyo (JP)

(72) Inventors: Keisuke Nakano, Suntou-gun (JP); Satoru Koyama, Mishima (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/390,524

(22) Filed: Apr. 22, 2019

(65) Prior Publication Data

US 2019/0334268 A1 Oct. 31, 2019

(30) Foreign Application Priority Data

Apr. 27, 2018 (JP) ................... 2018-087528
Oct. 29, 2018 (JP) ................... 2018-203275
Feb. 27, 2019 (JP) ................... 2019-034904

(51) Int. Cl.
| | | |
|---|---|---|
| *H01R 12/00* | (2006.01) | |
| *H01R 12/79* | (2011.01) | |
| *H05K 1/14* | (2006.01) | |
| *H01B 7/08* | (2006.01) | |
| *G03G 15/00* | (2006.01) | |

(52) U.S. Cl.
CPC ............ *H01R 12/79* (2013.01); *G03G 15/80* (2013.01); *H01B 7/08* (2013.01); *H05K 1/147* (2013.01)

(58) Field of Classification Search
CPC ...... H01R 12/79; H01R 12/62; H01R 31/005; H05K 1/147; H05K 3/244; H01B 7/08; G03G 15/80; B41J 2/14201; B60N 2/0224; H04Q 1/08; G06F 1/1662; G06F 1/185
USPC ......................................... 439/67
See application file for complete search history.

(56) References Cited

U.S. PATENT DOCUMENTS

| | | | | |
|---|---|---|---|---|
| 6,098,127 A | * | 8/2000 | Kwang | H01R 31/005 361/679.4 |
| 6,429,544 B1 | * | 8/2002 | Sasaki | B60N 2/0224 307/10.1 |
| 9,090,062 B2 | * | 7/2015 | Watanabe | B41J 2/14201 |
| 2006/0266548 A1 | * | 11/2006 | Hirashima | H05K 3/244 174/260 |
| 2008/0174951 A1 | * | 7/2008 | Mundt | G06F 1/1662 361/679.41 |
| 2010/0186995 A1 | * | 7/2010 | Yeh | H01R 12/62 174/254 |
| 2011/0228473 A1 | * | 9/2011 | Anderson | H04Q 1/08 361/679.58 |

(Continued)

FOREIGN PATENT DOCUMENTS

| | | |
|---|---|---|
| JP | 2002-324610 A | 11/2002 |
| JP | 2010-282864 A | 12/2010 |

*Primary Examiner* — Jean F Duverne
(74) *Attorney, Agent, or Firm* — Canon U.S.A., Inc., IP Division

(57) ABSTRACT

The present disclosure is a printed circuit board on which a connector to connect with a flexible flat cable or a flexible printed circuit board is mounted. The printed circuit board including a receiving port at which the connector receives the flexible flat cable or the flexible printed circuit board; and an opening that is disposed between an end of the printed circuit board facing the receiving port of the connector and a position corresponding to at least one of end portions of the receiving port.

16 Claims, 14 Drawing Sheets

(56) References Cited

U.S. PATENT DOCUMENTS

2016/0041937 A1* 2/2016 Aldridge ............... G06F 1/185
    710/313

* cited by examiner

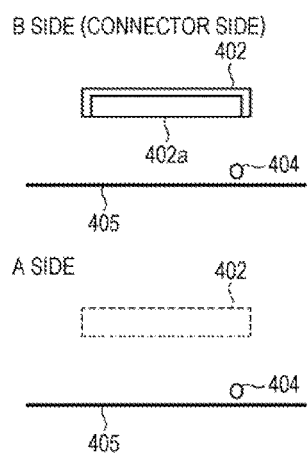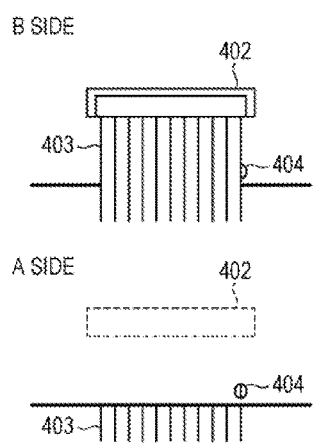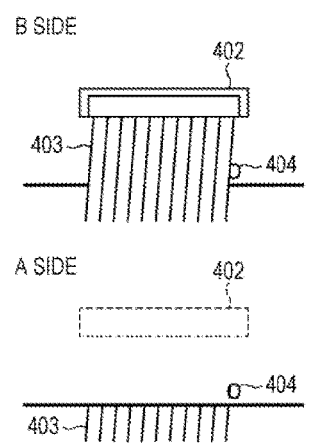

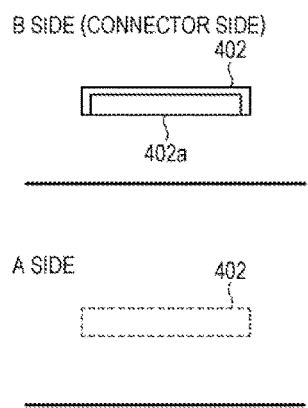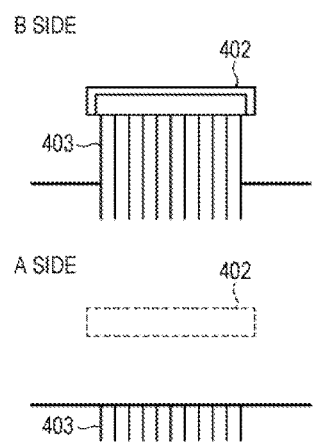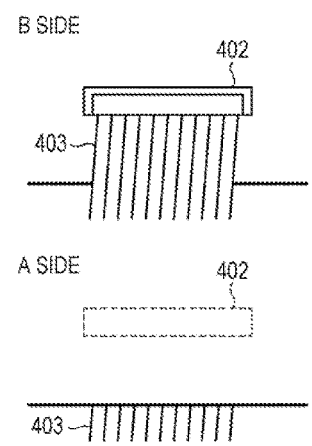

FIG. 10
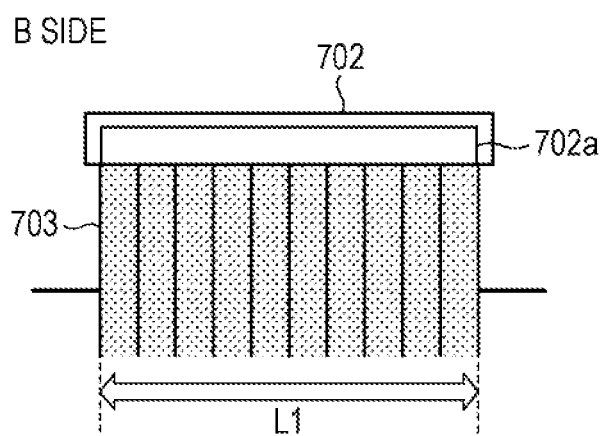
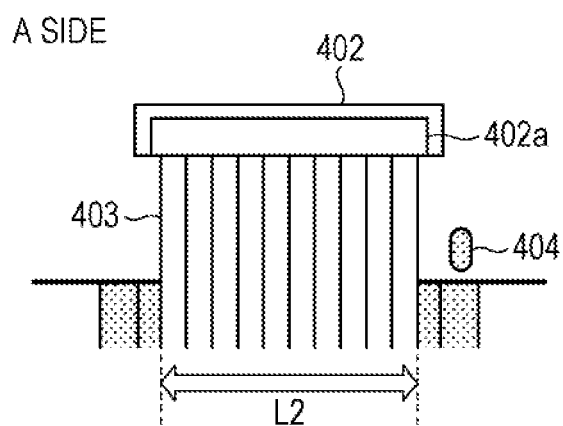

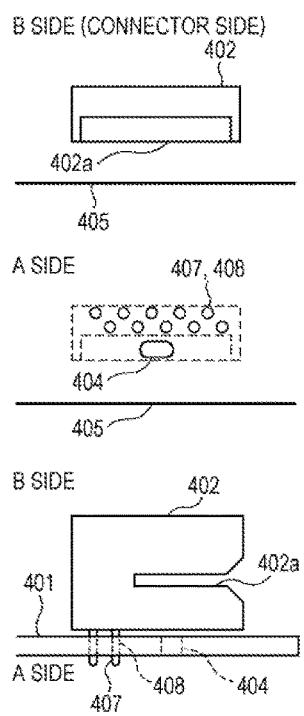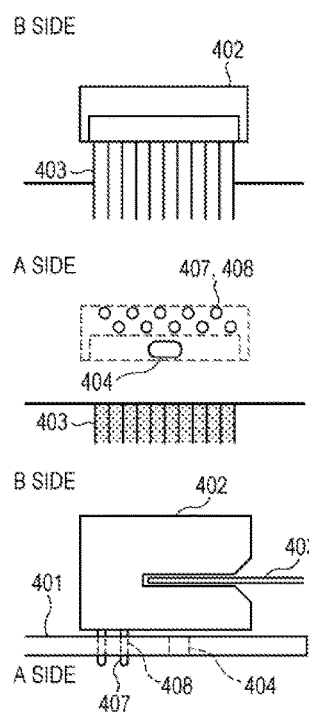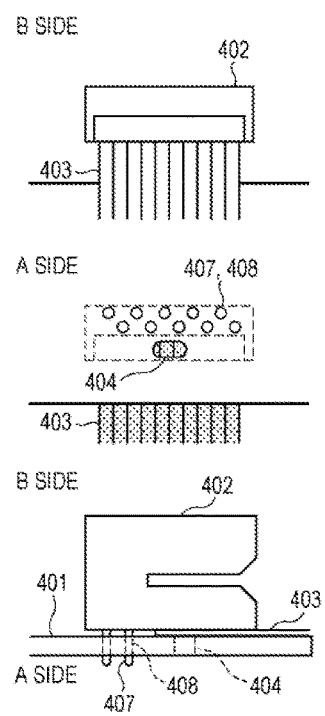

FIG. 12A
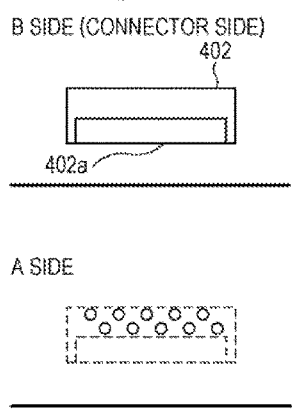
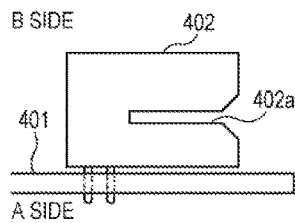
FIG. 12B
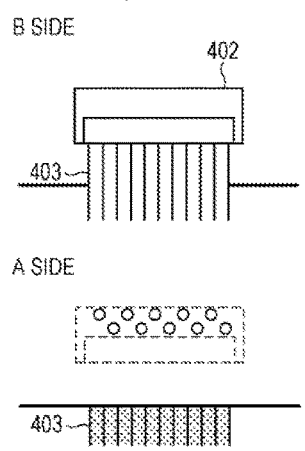
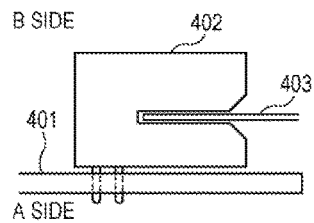
FIG. 12C
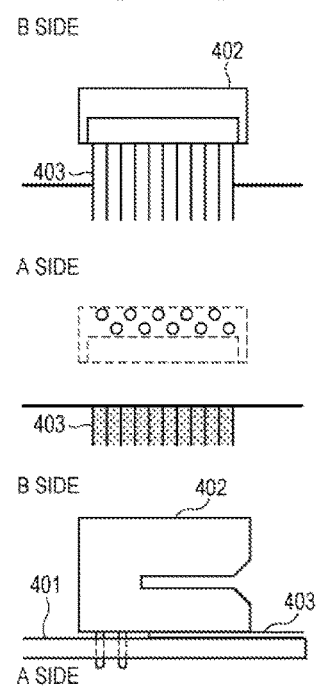
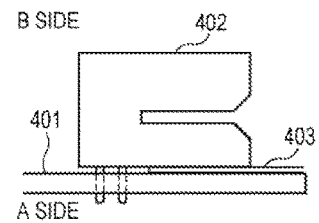

FIG. 16
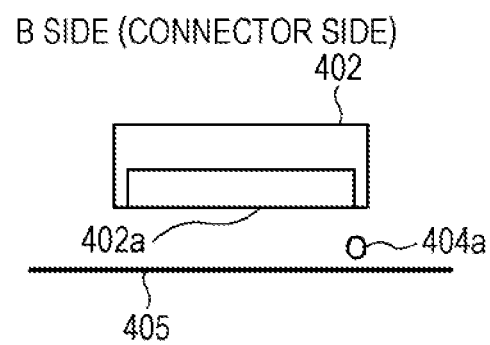
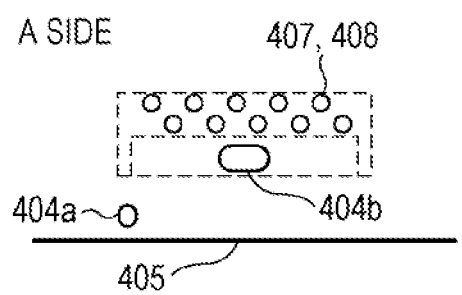
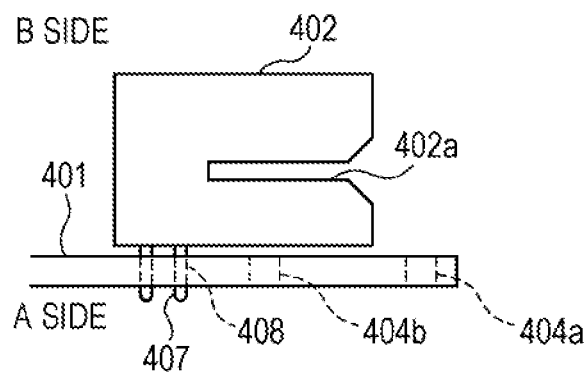

PRINTED CIRCUIT BOARD AND IMAGE FORMING APPARATUS HAVING PRINTED CIRCUIT BOARD

BACKGROUND OF THE INVENTION

Field of the Invention

The present disclosure relates to a printed circuit board to which a flexible flat cable (FFC) and a flexible printed circuit board (FPC) are connected, and an image forming apparatus including the printed circuit board.

Description of the Related Art

Conventionally, in image forming apparatuses such as copying machines and printers, at bundle of a plurality of electric wires, FFC, FPC, or the like is often used as a component for connecting a plurality of printed circuit boards. The FFC and the FPC contribute to size reduction and cost reduction of the apparatus but are low in insertability into a connector mounted on the printed circuit board as compared with the bundle of wires to be connected to a connector with protruding pins. As a result, when the FFC is obliquely inserted by mistake into the connector or when the FFC is inserted in the gap between the connector and the printed circuit board, for example, it leads to malfunctioning or breakage of the electronic device due to poor connection.

According to Japanese Patent Laid-Open No. 2010-282864, reference lines are provided on the surface of the FFC and the surface of the printed circuit board with the connector to check whether the FFC is properly inserted into the connector. The two reference lines are configured to overlap when the FFC is normally connected to the connector, which allows the operator to visually check the connection state of the FFC. In addition, photographing the two reference lines by a camera and comparing the patterns makes it possible to automatically check the connection state of the FFC.

However, in the case of adopting the configuration described in Japanese Patent Laid-Open No. 2010-282864, the operator can check the connection state of the FFC from the connector-mounted side of the printed circuit board, but cannot check the connection state of the FFC from the side of the printed circuit board opposite to the connector-mounted side. This can restrict the arrangement position of the printed circuit board.

SUMMARY OF THE INVENTION

An aspect of the present disclosure is to check whether an FFC or an FPC is properly inserted into a connector from the side opposite to the connector-mounted surface of a printed circuit board.

A printed circuit board of the present disclosure for achieving the above aspect is a printed circuit board on which a connector to connect with a flexible flat cable or a flexible printed circuit board is mounted. The printed circuit board has a receiving port at which the connector receives the flexible flat cable or the flexible printed circuit board and an opening that is disposed between end of the printed circuit board facing the receiving port of the connector and a position corresponding to at least one of end portions of the receiving port.

A printed circuit board of the present disclosure for achieving the above aspect is a printed circuit board on which a connector to connect with a flexible flat cable or a flexible printed circuit hoard is mounted. The printed circuit board has a first surface including the connector for receiving the flexible flat cable or the flexible printed circuit board, a second surface opposite the first surface, and an opening from the first surface to the second surface where a portion of the flexible flat cable or the flexible printed circuit board is visible through the opening from the second surface while the flexible flat cable or the flexible printed circuit board is vertically connected to the connector on the first surface.

A printed circuit board of the present disclosure for achieving the above aspect is a printed circuit board on which a connector to connect with a flexible flat cable or a flexible printed circuit board is mounted. The printed circuit board has a first surface including the connector for receiving the flexible flat cable or the flexible printed circuit board, a second surface opposite the first surface, and an opening from the first surface to the second surface at a position corresponding to a receiving port where the connector receives the flexible flat cable or the flexible printed circuit board. A printed circuit board of the present disclosure for achieving the above aspect is a printed circuit board on which a connector to connect with a flexible flat cable or a flexible printed circuit board is mounted. The printed circuit board has a first surface including the connector for receiving the flexible flat cable or the flexible printed circuit board, a second surface opposite the first surface, an opening from the first surface to the second surface through which a portion of the connector is visible when the printed circuit board is seen from the second surface to the first surface on which the connector is mounted while the flexible flat cable or the flexible printed circuit board is inserted into a receiving port of the connector. When the printed circuit board is seen from the side opposite to the surface on which the connector is mounted while the flexible flat cable or the flexible printed circuit board is inserted into a gap between the connector and the printed circuit board, a portion of the connector is not visible from the opening or area of the connector visible from the opening is smaller than in a state where the flexible flat cable or the flexible printed circuit board is inserted into the receiving port.

Further features of the present disclosure will become apparent from the following description of exemplary embodiments (with reference to the attached drawings).

BRIEF DESCRIPTION OF THE DRAWINGS

FIGS. 1A to 1C are configuration diagrams of printed circuit board in a first embodiment.

FIGS. 4A to 4C are configuration diagrams of a conventional printed circuit board in the first embodiment.

FIG. 10 is a configuration diagram of a printed circuit board in a case where connectors are provided on both sides of the printed circuit board.

FIGS. 11A to 11C are configuration diagrams of a printed circuit board in a fourth embodiment.

FIGS. 12A to 12C are configuration diagrams of a conventional printed circuit board in the fourth embodiment.

FIG. 16 is a configuration diagram of a printed circuit board in a sixth embodiment.

DESCRIPTION OF THE EMBODIMENTS

First Embodiment

In the present embodiment, an electrophotographic laser beam printer is taken as an embodiment of an image forming apparatus.

<Image Forming Apparatus>

Figure 2:
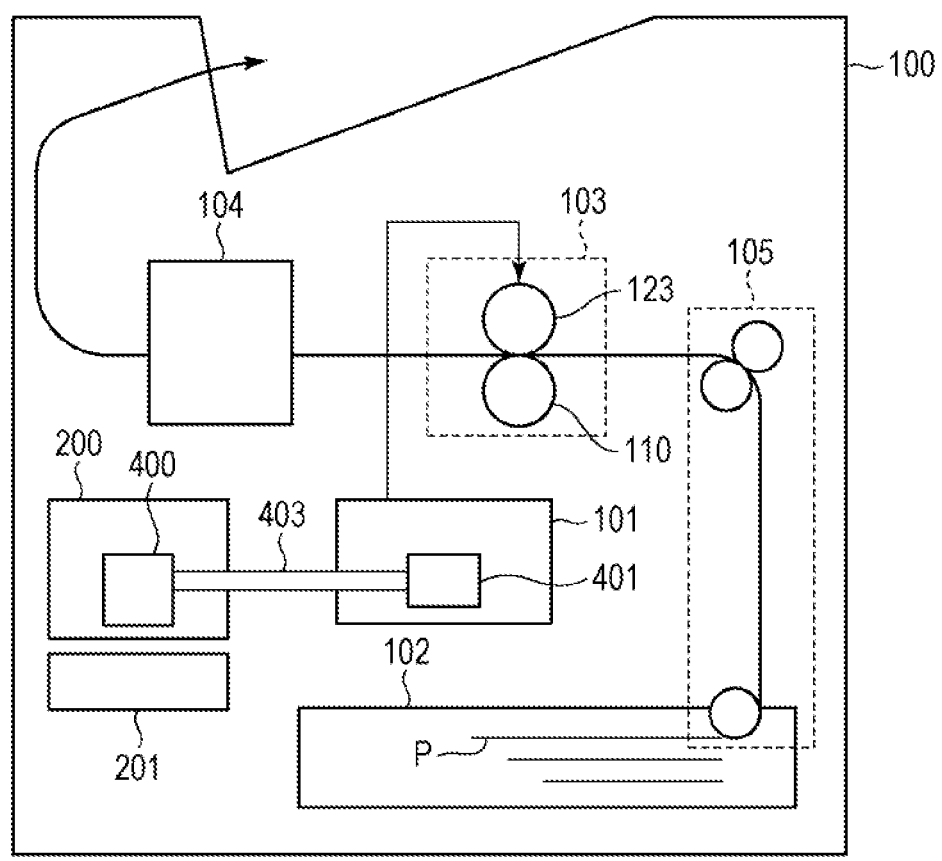
FIG. 2 is a diagram illustrating a schematic configuration of an image forming apparatus.

FIG. 2 illustrates a schematic configuration of a laser beam printer 100 (hereinafter referred to as a printer 100) in the present embodiment. Sheets P stacked on the sheet feeding cassette 102 are conveyed to an image forming unit 103 by the paper feed portion 105. The image forming unit 103 includes a charging unit, a developing unit, and a cleaning unit (not illustrated), and further includes a photosensitive drum 123 and a transfer unit 110. The surface of the photosensitive drum 123 is charged by the charging unit, and an electrostatic latent image is formed on the photosensitive drum 123 by the laser light output from an exposure unit 101. Then, the electrostatic latent image is developed with toner by the developing unit, whereby a toner image is formed on the photosensitive drum 123. The toner image formed on the photosensitive drum 123 is transferred onto the sheet P conveyed by the transfer unit 110. The toner image transferred onto the sheet P is heated and pressed by the fixing unit 104 and fixed on the sheet P. Thereafter, the sheet P is discharged to the outside of the printer 100. The series of controls is performed by an engine control unit 200.

In this case, a printed circuit board 400 of the engine control unit 200 and a printed circuit board 401 of the exposure unit 101 are connected by a flexible flat cable 403 (hereinafter referred to as FFC 403). The FFC 403 will be described as an embodiment in the present embodiment. Alternatively, the printed circuit boards may be connected by a flexible printed circuit board (hereinafter referred to as FPC). The controller unit 201 outputs a video signal to the engine control unit 200 based on a print command and image information from a host computer (such as a PC). Then, the engine control unit 200 outputs a video signal to the exposure unit 101 via the FFC 403. In accordance with the video signal thus received, the exposure unit 101 irradiates the photosensitive drum 123 with laser light.

<Arrangement of the Exposure Unit 101>

Figure 3A:
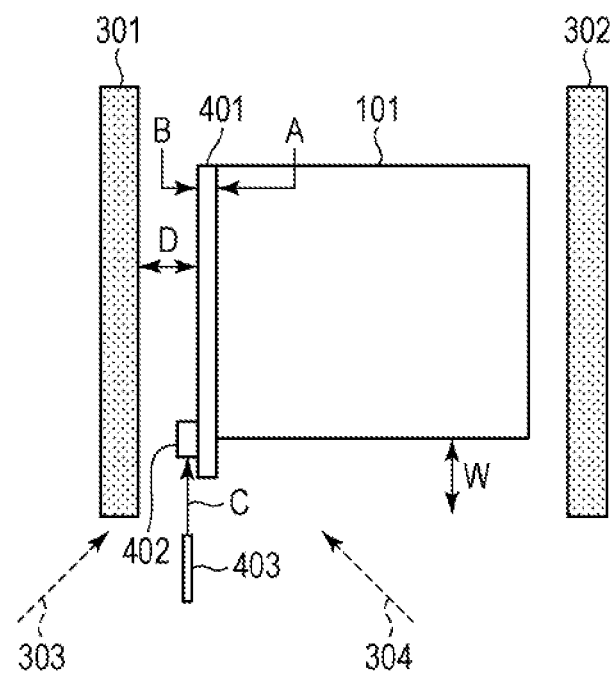
FIGS. 3A and 3B are diagrams illustrating an arrangement of an exposure unit inside the image forming apparatus.

FIG. 3A is a diagram illustrating the arrangement of the exposure unit 101 in the printer 100, and illustrates a top view of the printer 100. The exposure unit 101 is disposed in a space sandwiched between frames 301 and 302 of the printer 100. Further, the printed circuit board 401 included in the exposure unit 101 is provided on the side surface of the exposure unit 101 and is opposed to the frame 301. A laser diode for emitting a laser beam and the like are mounted on the A side of the printed circuit board 401, and a connector 402 to connect to the FFC 403 is mounted on a B side of the printed circuit hoard 401.

Figure 3B:
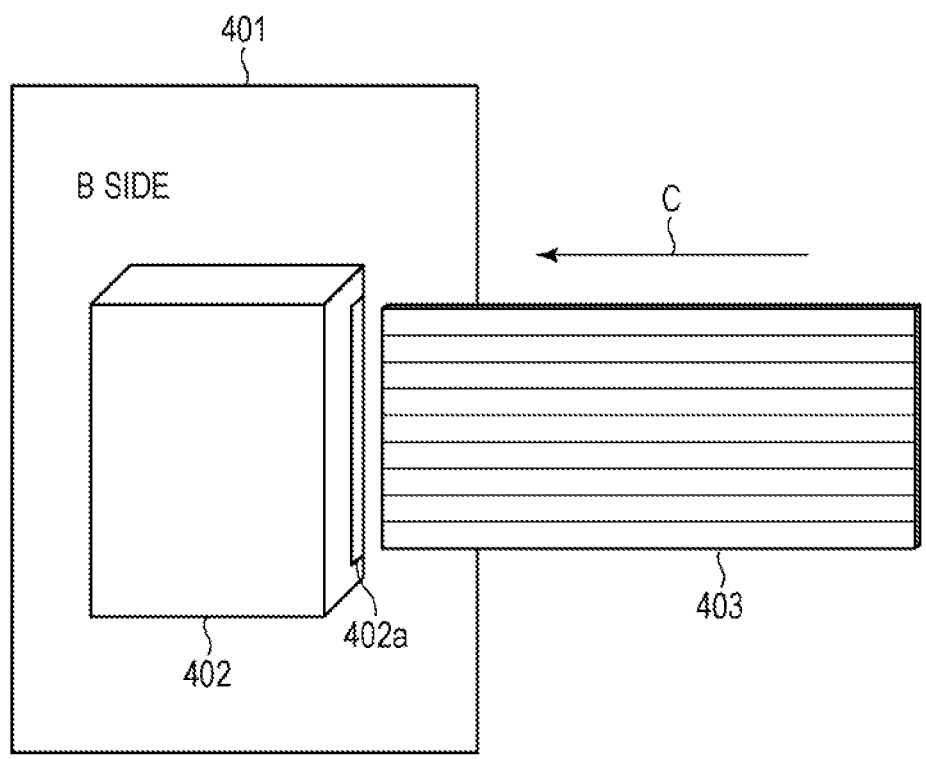

The connector 402 is a right angle connector. The FFC 403 is connected to a receiving port 402a of the connector 402 in the direction of an arrow C, that is, along the direction parallel to the B side of the printed circuit hoard 401 as illustrated in FIG. 3B. In this case, FIG. 3B is a view seen from a direction indicated by a dashed arrow 303. However, this is only for explaining the relationship between the connector 402 and the FFC 403, and is different from the diagram an operator or the like in charge of connecting the FFC 403 to the connector 402 actually sees. Specifically, the frame 301 is omitted in FIG. 3B. In addition, a check hole 404 to be described later is also omitted in this diagram.

Since a signal such as a video signal is to be transmitted from the engine control aunt 200 to the exposure unit 101, the FFC 403 having several ten pins is used. In the case of using the FFC 403 with a large number of pins, there is a high possibility that the FFC 403 is obliquely inserted by mistake to the connector 402. In this case, in order for the operator to check the connection state of the FFC 403 from the direction indicated by the dashed arrow 303, it is necessary to widen the interval D between the frame 301 and the printed circuit board 401 illustrated in FIG. 3A. However, widening the interval D to secure the space for checking the connection state of the FFC 403 leads to an increase in the size of the printer 100.

On the other hand, it is conceivable to arrange the connector 402 on the side opposite to the frame 301, that is, on the A side of the printed circuit board 401. Accordingly, the operator can check the connection state of the FFC 403 from the direction indicated by a dashed arrow 304, and the interval D can be minimized. However, when the connector 402 is disposed on the A side of the printed circuit board 401, it is necessary to lengthen the printed circuit board 401 to arrange the connector 402. In this case, it is necessary to widen an interval W illustrated in FIG. 3A, leading to an increase in the size of the printer 100. In addition, the position of the connector 402 to be mounted on the printed circuit board 401 is restricted.

<Configuration of the Printed Circuit Board 401>

Next, the configuration of the printed circuit board 401 will be described with reference to FIGS. 1A to 1C and 4A to 4C. FIGS. 1A to 1C illustrate a configuration of the present embodiment, and FIGS. 4A to 4C illustrate a conventional configuration. In either configuration, it is assumed that the connector 402 is mounted on the B side of the printed circuit board 401.

First, descriptions will be given with reference to FIGS. 4A to 4C. FIG. 4A illustrates a state in which the FFC 403 is not connected, FIG. 4B illustrates a state in which the FFC 403 is normally connected to the connector 402 (vertically connected state), and FIG. 4C illustrates a state in which the FFC 403 is obliquely connected to the connector 402. These diagrams are views of the printed circuit board 401 seen from a direction perpendicular to the printed circuit board 401, which are a view from the B side (connector side) and a view from the A side in each state. The view from the A side is horizontally inverted. The broken lines in the views from the A side indicate that the printed circuit board 401 is actually hidden and cannot be seen. As illustrated in FIGS. 4A to 4C, the state of connection of the FFC 403 to the connector 402 cannot be visually checked from the side A in contrast to the side B on which the connector 402 is mounted. Therefore, it is difficult to check from the A side whether the FFC 403 is obliquely inserted into the connector 402.

On the other hand, the printed circuit board 401 of FIGS. 1A to 1C has a check hole 404 formed in accordance with the end portion of the FFC 403 to improve the visibility. FIG. 1A illustrates a state in which the FFC 403 is not connected, FIG. 1B illustrates a state in which the FFC 403 is normally connected to the connector 402, and FIG. 1C illustrates a state in which the FFC 403 is obliquely connected to the connector 402. The check hole 404 is formed at a position where, in the state where the FFC 403 is normally connected to the connector 402, a portion of the FFC 403 is visible from the A side via the check hole 404. By providing the check hole 404, when the FFC 403 is obliquely connected to the connector 402, the FFC 403 cannot be visually checked from the check hole 404 or the visible amount (area) becomes small. Therefore, whether the FFC 403 is normally connected to the connector 402 can be checked also from the A side, so that it is unnecessary to widen the interval D described in FIG. 3A.

As illustrated in FIGS. 1A to 1C, the check hole 404 is included in the area between the receiving port 402a of the connector 402 and a substrate end 405 of the printed circuit board 401 opposed to the receiving port 402a and is formed at a position corresponding to one end of the receiving port 402a as seen in the longitudinal direction. Alternatively, the check hole 404 is included in the area between the receiving port 402a of the connector 402 and the substrate end 405 of the printed circuit board 401 opposed to the receiving port 402a and is formed at a position corresponding to one end of the FFC 403 connected to the connector 402 as seen in the width direction.

Further, the more the check hole 404 and the connector 402 are distant from each other, the larger the change amount of the FFC 403 visible through the check hole 404 becomes, and it is easier to determine the connection state of the FFC 403. However, if the connector 402 is disposed at a position far from the substrate end 405 to separate the check hole 404 from the connector 402, assembling workability in inserting the FFC 403 into the connector 402 is deteriorated. Therefore, the connector 402 is disposed at a position away from the substrate end 405 by an appropriate distance, for example, at a position where the operator's hand enters and the FFC 403 does not break.

In addition, if the check hole 404 is formed at a position close to the substrate end 405 to separate the check hole 404 from the connector 402, the rigidity near the substrate end 405 decreases, and the printed circuit board 401 may be damaged. Therefore, the check hole 404 is formed at a position separated from the substrate end 405 by an appropriate distance, for example, a position where rigidity of the printed circuit board 401 is secured.

Further, by making the check hole 404 elongated along the routing direction of the FFC 403 (the direction in which the FFC 403 is inserted into the connector 402), the connection state of the FFC 403 can be easily determined. However, the check hole 404 needs to be set to an appropriate size because the area usable for pattern wiring of the printed circuit board 401 is reduced by the check hole 404.

As described above, according to the present embodiment, providing the check hole 404 in the printed circuit board 401 makes it possible to check whether the FFC 403 and the FPC are not obliquely inserted into the connector 402 from the side opposite to the connector-mounted surface of the printed circuit board 401.

Figure 5:
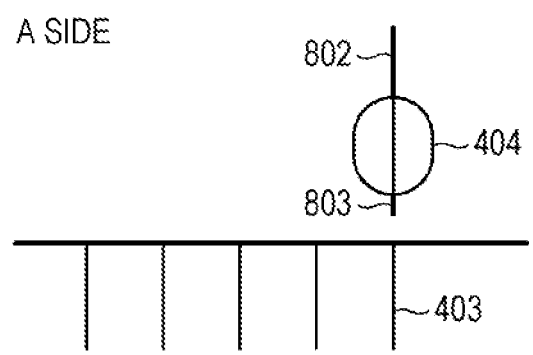
FIG. 5 is a configuration diagram of a printed circuit board provided with silk.

In the present embodiment, as illustrated in FIG. 5, liner silk 802 and silk 803 may be provided on the printed circuit board 401 around the check hole 404 along the routing direction of the FFC 403 to improve the visibility. In addition, the amount of the FFC 403 visible from the check hole 404 may be automatically determined by an image recognition technology using a device such as a camera. For example, it may be determined that the FFC 403 is normally connected when the occupancy rate of the FFC 403 is 30% to 70% inclusive to the area of the check hole 404.

Figure 6:
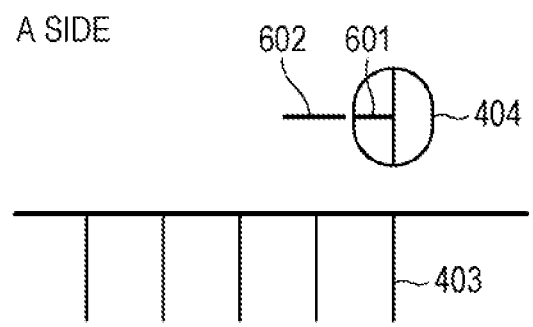
FIG. 6 is a configuration diagram in which FFC is marked and a printed circuit board is provided with silk.

Further, in the present embodiment, as illustrated in FIG. 6, a linear mark 601 may be written in the FFC 403 in a range visible from the check hole 404 along the direction perpendicular to the routing direction of the FFC 403. A linear silk 602 may be provided on the printed circuit board 401 around the check hole 404 along the same direction to improve the visibility. This makes it possible to determine not only whether the FFC 403 is obliquely inserted into the connector 402 but also whether the FFC 403 sufficiently fits into the connector 402.

Figure 7:
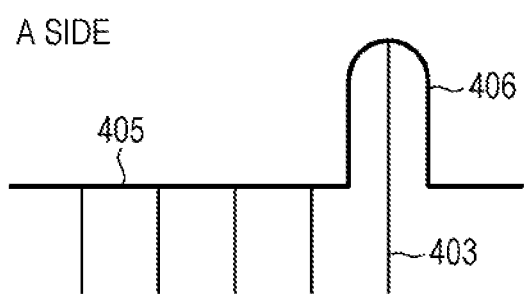
FIG. 7 is a configuration diagram in which the printed circuit board in the first embodiment is provided with cutouts for checking.

In the present embodiment, the check hole 404 is used as an opening for checking. However, as illustrated in FIG. 7, the check hole 404 may be extended to the substrate end 405 to form a concave cutout 406. In this case, the connector 402 can be arranged closer to the substrate end 405. Further, making the check cutout 406 makes it possible to check the connection state of the FFC 403 from the A side while suppressing concern about breakage of the printed circuit board 401 and deterioration of assembly workability.

Second Embodiment

In a second embodiment, a plurality of check holes is formed in the first embodiment. In the second embodiment, two check holes, a check hole 404 and a check hole 505, are provided along the routing direction of the FFC 403 to determine the connection state of the FFC 403 to the connector 402. Providing the plurality of check holes along the routing direction of the FFC 403 improves the visibility and using a device such as a camera improves the accuracy of determination. The main components are the same as those of the first embodiment, and only the components different from those of the first embodiment will be described here.

Figure 8A:
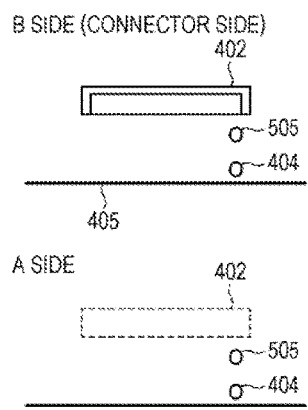
FIGS. 8A to 8C are configuration diagrams of a printed circuit board in a second embodiment.
Figure 8B:
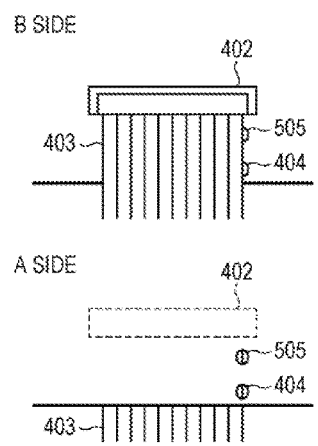
Figure 8C:
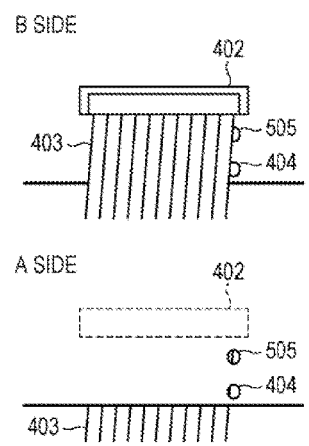

FIGS. 8A to 8C illustrate the configuration of the printed circuit board 401 in the second embodiment. FIG. 8A illustrates a state in which the FFC 403 is not connected, FIG. 8B illustrates a state in which the FFC 403 is normally connected to the connector 402, and FIG. 8C illustrates a state in which the FFC 403 is obliquely connected to the connector 402. The check hole 404 and the check hole 505 are formed at positions where, in the state where the FFC 403 is normally connected to the connector 402, a portion of the FFC 403 is visible from the A side via the check hole 404 and the cheek hole 505. As the check hole 404 and the check hole 505 are positioned more distant from the substrate end 405, it is easier to determine the connection state of the FFC 403. However, the connector 402 is preferably separated by an appropriate distance from the substrate end 405 because, if the position of the connector 402 is greatly separated from the substrate end 405, the assembling workability is lowered.

As illustrated in FIGS. 8A to 8C, when the check hole 404 and the check hole 505 are provided such that the FFC 403 is obliquely connected to the connector 402, it can be understood that the amounts of the FFC 403 visible from the check hole 404 and the check hole 505 are largely different.

The state of connection of the FFC 403 to the connector 402 is determined from the difference in appearance of the FFC 403 seen from the check hole 404 and the check hole 505. The connection state of the FFC 403 may be determined by automatically comparing the amount of the FFC 403 visible from the check hole 404 with the amount of the FFC 403 visible from the check hole 505 by an image recognition technology using a device such as a camera. For example, it may be determined that the FFC 403 is normally connected when the ratio of the amount of the FFC 403 visible from the check hole 505 to the amount of the FFC 403 visible from the check hole 404 is 90 to 110%. Further, as in the first embodiment, the accuracy of determination can be improved by making, the determination in combination with the occupation ratio of the FFC 403 to the area of the cheek hole 404 and the occupation ratio of the FFC 403 to the area of the check hole 505.

As described above, according to the present embodiment, providing the check hole 404 and the check hole 505 in the printed circuit board 401 makes it possible to check whether the FFC 403 and the FPC are not obliquely inserted into the connector 402 from the side opposite to the connector-mounted surface of the printed circuit board 401.

In the present embodiment as well, the linear silk 802 and silk 803 illustrated in FIG. 5 may be provided at positions corresponding to the check hole 404 and the cheek hole 505, respectively. In addition, the mark 601 illustrated in FIG. 6 may be provided in the FFC 403, and the linear silk 602 may be provided at positions respectively corresponding to the check hole 404 and the check hole 505. Further, out of the plurality of check holes, the check hole 404 closer to the substrate end 405 may be the cutout 406 illustrated in FIG. 7.

Third Embodiment

In a third embodiment, the positional relationship between a plurality of check holes is changed in the second embodiment. In the third embodiment, two check holes, the check hole 404 and a check hole 606, are provided in a direction perpendicular to the routing direction of the FFC 403 to determine the state of connection of the FFC 403 to the connector 402. Providing the plurality of check holes in the routing direction of the FFC 403 makes it possible to improve the visibility while maintaining the assembling workability by positioning the connector 402 on the substrate end 405 as much as possible. The main components are the same as those of the first embodiment, and only the components different from those of the first embodiment will be described here.

Figure 9A:
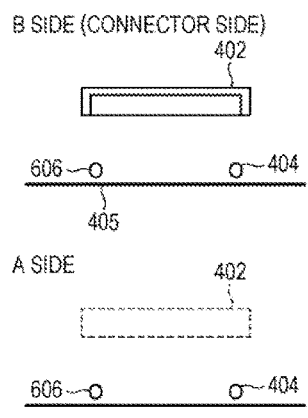
FIGS. 9A to 9C are configuration diagrams of a printed circuit board in a third embodiment.
Figure 9B:
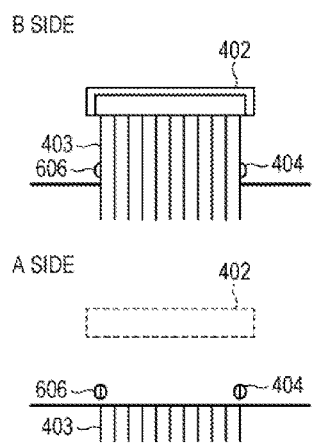
Figure 9C:
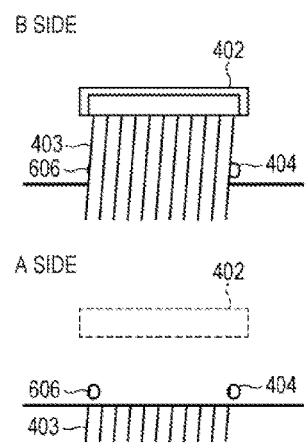

FIGS. 9A to 9C illustrate the configuration of the printed circuit board 401 in the third embodiment. FIG. 9A illustrates a state in which the FFC 403 is not connected, FIG. 9B illustrates a state in which the FFC 403 is normally connected to the connector 402, and FIG. 9C illustrates a state in which the FFC 403 is obliquely connected to the connector 402. The check hole 404 and the check hole 606 are formed at positions where, in the state where the FFC 403 is normally connected to the connector 402, portions of the both ends of the FFC 403 are visible from the A side via the check hole 404 and the check hole 606.

As illustrated in FIGS. 9A to 9C, when the check hole 404 and the check hole 606 are provided such that the FFC 403 is obliquely connected to the connector 402, it can be understood that the amounts of the FFC 403 visible from the check hole 404 and the check hole 606 are largely different. The state of connection of the FFC 403 to the connector 402 is determined from the difference in appearance of the FFC 403 seen from the check hole 404 and the check hole 606. The connection state of the FFC 403 may be determined by automatically comparing the amount of the FFC 403 visible from the check hole 404 with the amount of the FFC 403 visible from the check hole 606 by an image recognition technology using a device such as a camera. For example, it may be determined that the FFC 403 is normally connected when the ratio of the amount of the FFC 403 visible from the check hole 606 to the amount of the FFC 403 visible from the check hole 404 is 90 to 110%. Further, as in the first embodiment, the accuracy of determination can be improved by making the determination in combination with the occupation ratio of the FFC 403 to the area of the check hole 404 and the occupation ratio of the FFC 403 to the area of the check hole 606.

Therefore, according to the present embodiment, providing the check hole 404 and the check hole 606 in the printed circuit board 401 makes it possible to check whether the FFC 403 and the FPC are not obliquely inserted into the connector 402 from the side opposite to the connector-mounted surface of the printed circuit board 401. In particular, providing the plurality of check holes in a direction perpendicular to the routing direction of the FFC 403 makes it possible to bring the connector 402 close to the substrate end 405 and improve the assembly workability In the present embodiment as well, the linear silk 802 and silk 803 illustrated in FIG. 5 may be provided at positions corresponding to the check hole 404 and the check hole 606, respectively. In addition, the mark 601 illustrated in FIG. 6 may be provided in the FFC 403, and the linear silk 602 may be provided at positions respectively corresponding to the check hole 404 and the check hole 606. Further, each of the check hole 404 and the check hole 606 may be formed as the cutout 406 illustrated in FIG. 7.

In the first to third embodiments, the configuration in which the connector 402 is mounted only on the B side of the printed circuit board 401 has been described as an embodiment. However, the present disclosure is not limited to this. The present disclosure can also be applied to a configuration in which connectors are mounted on both sides of the printed circuit board 401. Hereinafter, this configuration will be described taking the first embodiment as an embodiment with reference to FIG. 10.

Referring to FIG. 10, a connector 702 is mounted on the B side of the printed circuit board 401, and the connector 402 is mounted on the A side of the printed circuit board 401. In this case, a length L1 of a receiving port 702a of the connector 702 as seen in the longitudinal direction and a length L2 of the receiving port 402a of the connector 402 as seen in the longitudinal direction are different, and the length L1 is made longer than the length L2. In this case, the check hole 404 is formed at a position corresponding to a longitudinal end portion of the receiving port 702a longer in the longitudinal direction. Accordingly, as seen from the A side, the connection state of the FFC 403 can be checked and the connection state of the FFC 703 can also be checked via the check hole 404.

Fourth Embodiment

In the first to third embodiments, it is checked whether the FFC 403 is obliquely inserted into the connector 402. In the present embodiment, it is checked whether the FFC 403 is erroneously inserted into the gap between the printed circuit board 401 and the connector 402. The main components are the same as those of the first embodiment, and only the components different from those of the first embodiment will be described here.

<Configuration of the Printed Circuit Board 401>

Next, the configuration of the printed circuit board 401 will be described with reference to FIGS. 11A to 11C and 12A to 12C. FIGS. 11A to 11C illustrate a configuration in the present embodiment, and FIGS. 12A to 12C illustrate a conventional configuration. In either configuration, it is assumed that the connector 402 is mounted on the B side of the printed circuit board 401.

First, descriptions will be given with reference to FIGS. 12A to 12C. FIG. 12A illustrates a state in which the FFC 403 is not connected, and FIG. 12B illustrates a state inn which the FFC 403 is normally connected to the connector 402 (the FFC 403 is inserted into the receiving port 402a of the connector 402). FIG. 12C illustrates a state in which the FFC 403 is erroneously inserted into the gap between the printed circuit board 401 and the connector 402. These diagrams are views of the FFC 403 seen from the B side (connector side) and the A side (both are views of the FFC 403 seen from a direction perpendicular to the printed circuit board 401) in each state, and a cross-sectional view of the FFC 403 seen from a direction horizontal to the printed circuit board 401. The views from the A side are horizontally inverted from the views from the B side. The broken lines in the views from the A side indicate that the FFC 403 is actually hidden behind the printed circuit board 401 and cannot be seen. For the sake of explanation, the FFC 403 seen from the A side is illustrated in a different color.

As illustrated in FIGS. 12A to 12C, the state of connection of the FFC 403 to the connector 402 cannot be visually checked from the side A in contrast to the side B on which the connector 402 is mounted. Therefore, it is difficult to check from the side A side whether the FFC 403 is inserted into the receiving port 402a of the connector 402 or inserted into the gap between the printed circuit board 401 and the connector 402. Referring to FIGS. 12A to 12C in which the FFC 403 is seen from a direction perpendicular to the printed circuit board 401, it seems difficult to check the connection state of the FFC 403 not only from the A side but also from the B side. However, as seen from the oblique direction with respect to the printed circuit board 401 as illustrated by the dashed arrow 303 in FIG. 3B, the connection state of the FFC 403 can be checked when seen from the B side.

On the other hand, the printed circuit board 401 of FIGS. 11A to 11C has the check hole 404 formed at a position corresponding to the receiving port 402a of the connector 402 to improve the visibility. FIG. 11A illustrates a state in which the FFC 403 is not connected, FIG. 11B illustrates a state in which the FFC 403 is normally connected to the connector 402, and FIG. 11C illustrates a state in which the FFC 403 is inserted between the printed circuit board 401 and the connector 402. The check hole 404 is formed at a position where, in the state where the FFC 403 is normally connected to the connector 402, a portion of the connector 402 is visible from the A side via the check hole 404. By providing the check hole 404, when the FFC 403 is inserted in the gap between the printed circuit board 401 and the connector 402, the FFC 403 is visible from the check hole 404 and the connector 402 is not visible. Otherwise, the visible amount (area) of the connector 402 is smaller than that in the state in which the FFC 403 is normally connected. Therefore, whether the FFC 403 is normally connected to the connector 402 can be checked also from the A side, which eliminates the need to widen the interval D illustrated in FIG. 3A.

As illustrated in FIGS. 11A to 11C, the check hole 404 is formed at a position corresponding to the receiving port 402a of the connector 402. As illustrated in the cross-sectional view, pins 407 extend from the connector 402 in the present embodiment, and openings 408 through which the pins 407 pass are formed on the printed circuit board 401 separately from the check hole 404. The pins 407 illustrated in FIGS. 11A to 11C pass from the side B on which the connector 402 is mounted through the openings 408, and reach the opposite side A and are connected to the pattern wiring.

Further, if the connector 402 and the check hole 404 are formed at positions close to the substrate end 405 in order to prevent deterioration of assembly workability at insertion of the FFC 403 into the connector 402, the rigidity near the substrate end 405 decreases, and the printed circuit board 401 may be damaged. Therefore, the check hole 404 is formed at a position separated from the substrate end 405 by an appropriate distance, for example, at a position where the operator's hand can enter and the rigidity of the printed circuit board 401 can be secured.

Further, by making the check hole 404 long along the longitudinal direction of the receiving port 402a of the connector 402, it is easy to determine the connection state of the FFC 403. However, the check hole 404 needs to be set to an appropriate size because the area usable for pattern wiring of the printed circuit board 401 is reduced by the check hole 404.

As described above, according to the present embodiment, providing the check hole 404 in the printed circuit board 401 makes it possible to check whether the FFC 403 is not inserted into the gap between the printed circuit board 401 and the connector 402 from the side opposite to the connector-mounted surface of the printed circuit board 401.

In addition, the amount of the connector 402 visible from the check hole 404 may be automatically determined by an image recognition technology using a device such as a camera. For example, in the case of FIGS. 11A to 11C, it may be determined that the FFC 403 is normally connected when the occupancy rate of the connector 402 is 100% to the area of the check hole 404.

Figure 13:
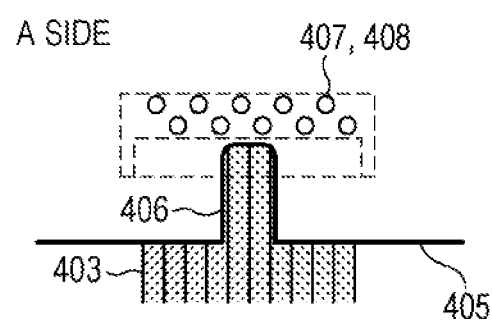
FIG. 13 is a configuration diagram in which the printed circuit board in the fourth embodiment is provided with cutouts for checking.

In the present embodiment, the check hole 404 is used as an opening for checking. However, as illustrated in FIG. 13, the check hole 404 may be extended to the substrate end 405 to form a concave cutout 406. In this case, the connector 402 can be arranged closer to the substrate end 405. Accordingly, it is possible to check the connection state of the FFC 403 from the A side while suppressing concern about breakage of the printed circuit board 401 and deterioration of assembly workability.

Fifth Embodiment

In a fifth embodiment, a plurality of check holes is formed in the fourth embodiment. In the fifth embodiment, two check holes, a check hole 404 and a check hole 505, are provided along the longitudinal direction of the receiving port 402a of the connector 402 to determine the connection state of the FFC 403 to the connector 402. By providing the plurality of check holes along the longitudinal direction of the receiving port 402a, even when the FFC 403 is inserted obliquely into the gap between the printed circuit board 401 and the connector 402, the connection state of the FFC 403 can be determined. The main components are the same as those of the fourth embodiment, and only the components different from those of the fourth embodiment will be described here.

Figure 14A:
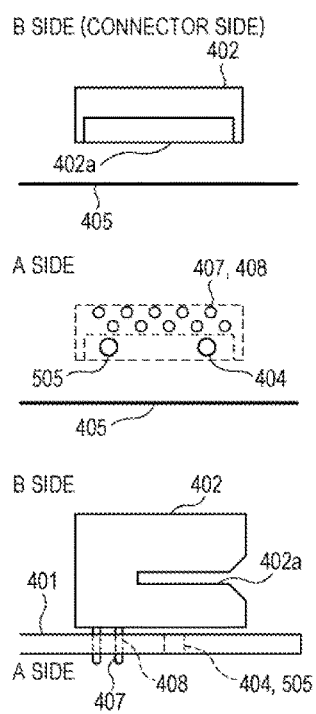
FIGS. 14A to 14C are configuration diagrams of a printed circuit board in a fifth embodiment.
Figure 14B:
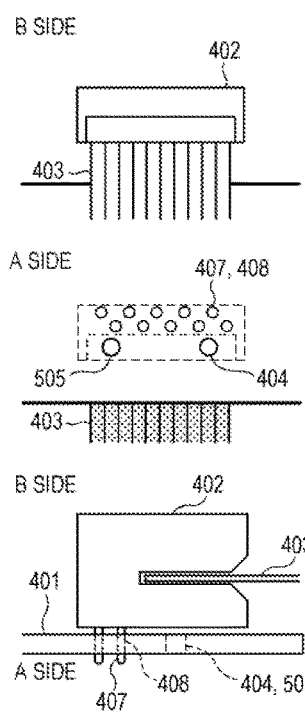
Figure 14C:
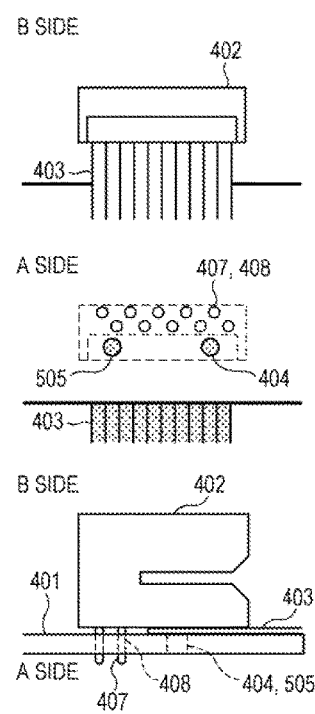

FIGS. 14A to 14C illustrate the configuration of the printed circuit board 401 in the fifth embodiment. FIG. 14A illustrates a state in which the FFC 403 is not connected, FIG. 14B illustrates a state in which the FFC 403 is normally connected to the connector 402, and FIG. 14C illustrates a state in which the FFC 403 is inserted the gap between the printed circuit board 401 and the connector 402. The check hole 404 and the check hole 505 are formed at positions where, in the state where the FFC 403 is normally connected to the connector 402, a portion of the connector 402 is visible from the A side via the check hole 404 and the check hole 505.

For example, referring to FIGS. 14A to 14C, in the case where the check hole 505 is not formed, when the FFC is inserted obliquely to the left, the FFC 403 is not visible from the check hole 404 and it may be erroneously determined that the FFC 403 is normally connected. As illustrated in FIGS. 14A to 14C, providing the check hole 404 and the check hole 505 makes it possible to determine the connection state of the FFC 403, even when the FFC 403 is inserted between the printed circuit board 401 and the connector 402 obliquely with respect to the connector 402. Further, suppressing the sizes of the check hole 404 and the check hole 505 makes it possible to improve the determination accuracy while suppressing the influence on the pattern wiring of the printed circuit board 401.

As described above, according to the present embodiment, providing the check hole 404 and the check hole 505 in the printed circuit board 401 makes it possible to check whether the FFC 403 is not inserted into the gap between the printed circuit board 401 and the connector 402 from the side opposite to the connector-mounted surface of the printed circuit board 401.

The connection state of the FFC 403 may be determined by automatically judging the amount of the connector 402 visible from the check hole 404 and the check hole 505 by an image recognition technology using a device such as a camera. For example, when the amounts of the connector 402 seen from the check hole 404 and the check hole 505 are both 100%, it may be determined that the FFC 403 is normally connected.

Also in the present embodiment, each of the check hole 404 and the check hole 505 may be formed as the cutout 406 illustrated in FIG. 13.

In the fourth to second embodiments, the configuration in which the connector 402 is mounted only on the B side of the printed circuit board 401 has been described as an embodiment. However, the present disclosure is not limited to this. The present disclosure can also be applied to a configuration in which connectors are mounted on both sides of the printed circuit board 401. Hereinafter, this configuration will be described taking the fourth embodiment as an embodiment with reference to FIGS. 15A and 15B.

Figure 15A:
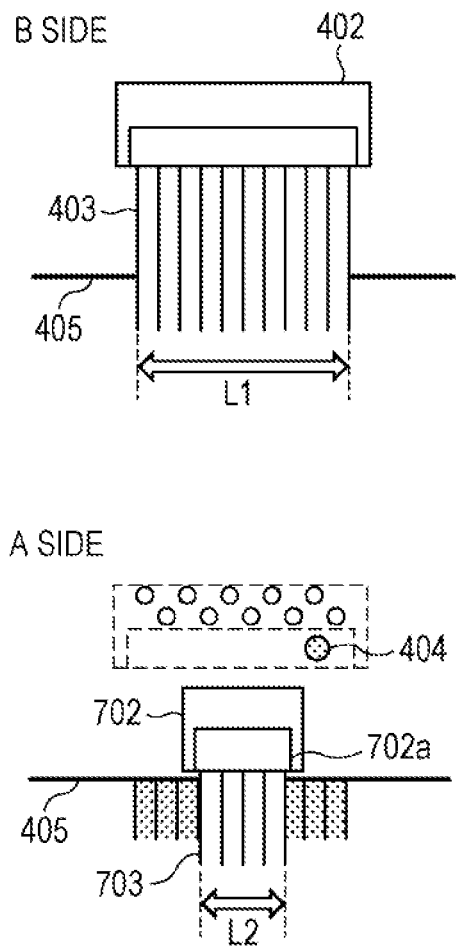
FIGS. 15A and 15B are configuration diagrams of a printed circuit board in a case where connectors are provided on both sides of the printed circuit board.
Figure 15B:
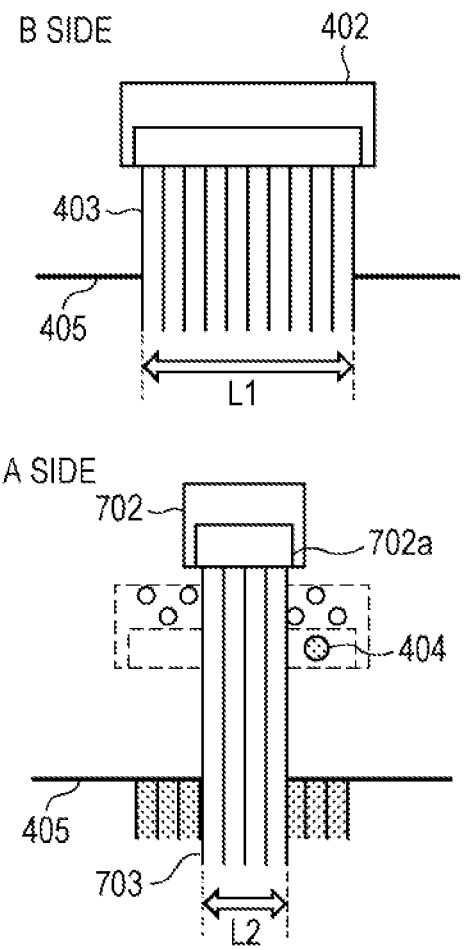

Referring to FIGS. 15A and 15B, a connector 702 is mounted on the A side of the printed circuit board 401, and a connector 402 is mounted on the B side of the printed circuit board 401. In this case, a length L1 of a receiving port 402a of the connector 402 as seen in the longitudinal direction and a length L2 of the receiving port 702a of the connector 702 as seen in the longitudinal direction are different, and the length L1 is made longer than the length L2.

Referring to FIG. 15A, the connector 702 is disposed closer to the substrate end 405 than the connector 402. In this case, the check hole 404 is formed at a position corresponding to the receiving port 402a of the connector 402. Accordingly, as seen from the A side, the connection state of the FFC 703 can be checked and the connection state of the FFC 403 can also be checked via the check hole 404. Referring to FIG. 15A, the connector 702 is included inside the width of the FFC 403 connected to the connector 402. However, the connector 702 may not be included inside the width of the FFC 403. Even in this case, the same advantageous effect can be obtained by forming the check hole 404 at a position corresponding to the receiving port 402a of the connector 402.

Referring to FIG. 15B the connector 702 is arranged at a position more distant from the substrate end 405 than the connector 402. In this case, the check hole 404 is located at a position corresponding to the receiving port 402a of the connector 402 and is located outside the receiving port 702a shorter in the longitudinal direction and inside the receiving port 402a longer in the longitudinal direction. Accordingly, as seen from the A side, the connection state of the FFC 703 can be checked and the connection state of the FFC 403 can also be checked via the check hole 404.

In these cases, the connector 702 is preferably an SMT type that is mounted without penetrating through the substrate rather than a DIP type mounted by penetrating through the substrate.

Sixth Embodiment

In the first to third embodiments, it is checked whether the FFC 403 is obliquely inserted into the connector 402, and in the fourth and fifth embodiments, it is checked whether the FFC 403 is erroneously inserted into the gap between the printed circuit board 401 and the connector 402. In relation to the present embodiment, a configuration capable of checking both of them will be described. The main components are the same as those of the first embodiment, and only the components different from those of the first embodiment will be described here.

FIG. 16 illustrates the configuration of the printed circuit board 401 in the present embodiment. FIG. 16 illustrates a state in which the FFC 403 is not connected. These diagrams are views of the FFC 403 seen from the B side (connector side) and the A side (both are views of the FFC 403 seen from a direction perpendicular to the printed circuit board 401), and a cross-sectional view of the FFC 403 seen from a direction horizontal to the printed circuit board 401. The view from the A side is horizontally inverted from the views from the B side. The broken line in the view from the A side indicates that the FFC 403 is actually hidden behind the printed circuit board 401 and cannot be seen.

The printed circuit board 401 of FIG. 16 has a check hole 404a formed in accordance with the end portion of the FFC 403 to improve the visibility. Further, the printed circuit board 401 of FIG. 16 has a check hole 404b formed at a position corresponding to the receiving port 402a of the connector 402 to improve the visibility. That is, the printed circuit board 401 of the present embodiment is a combination of the configuration of the first embodiment and the configuration of the fourth embodiment.

As described above, according to the present embodiment, providing the check hole 404a in the printed circuit board 401 makes it possible to check whether the FFC 403 and the FPC are not obliquely inserted into the connector 402 from the side opposite to the connector-mounted surface of the printed circuit board 401. Further, providing the check hole 404b in the printed circuit board 401 makes it possible to check whether the FFC 403 is not inserted into the gap between the printed circuit board 401 and the connector 402 from the side opposite to the connector-mounted surface of the printed circuit board 401.

Regarding the check hole 404a, any of the configurations described in above in relation to the first to third embodiments may be used. Regarding the check hole 404b, any of the configurations described above in relation to the fourth and fifth embodiments may be used.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-087528, filed Apr. 27, 2018, No. 2018-203275, filed Oct. 29, 2018, and No. 2019-034904, filed Feb. 27, 2019, which are hereby incorporated by reference herein in its entirety.

What is claimed is:

1. A printed circuit board on which a connector to connect with a flexible flat cable or a flexible printed circuit board is mounted, comprising:
    an opening that is disposed between an end of the printed circuit board and a position at which the connector is mounted,
    wherein, in a state where the flexible flat cable or the flexible printed circuit board is connected to the connector, when viewed from a direction perpendicular to the printed circuit board, the opening is disposed at a position corresponding to a position on a second line indicating an end of the flexible flat cable or the flexible printed circuit board, the second line crossing a first line indicating the end of the printed circuit board.

2. The printed circuit board according to claim 1, wherein the opening extends in a direction along the second line.

3. The printed circuit board according to claim 1, wherein the printed circuit board has a plurality of the openings formed side by side in a direction along the second line.

4. The printed circuit board according to claim 1, wherein, when viewed from a direction perpendicular to the printed circuit board, another opening different from the opening is disposed at a position corresponding to a third line indicating another end of the flexible flat cable, the third line being parallel to the second line indicating the end of the flexible flat cable in a state where the cable is connected to the connector.

5. The printed circuit board according to claim 3, wherein the plurality of openings is of the same size.

6. The printed circuit board according to claim 1,
    wherein another connector different from the connector is mounted to a corresponding position on a surface opposite to a surface on which the connector is mounted and
    wherein a width of the other connector is smaller than a width of the connector.

7. The printed circuit board according to claim 1, wherein the opening is a hole formed in the region between the connector and the end of the printed circuit board facing the connector.

8. The printed circuit board according to claim 1, wherein the opening is a cutout formed at the end of the printed circuit board facing the connector.

9. A printed circuit board on which a connector to connect with a flexible flat cable or a flexible printed circuit board is mounted, comprising:
    a connection portion through which the connector is connected to the printed circuit board;
    a receiving port at which the connector receives the flexible flat cable or the flexible printed circuit board, the receiving port being disposed closer to an end of the printed circuit board than the connection portion is, and
    an opening disposed at a position corresponding to a position of the receiving port on the printed circuit board, the opening being disposed closer to the end of the printed circuit board than the connection portion is.

10. The printed circuit board according to claim 9, wherein the opening extends along a longitudinal direction of the receiving port of the connector.

11. The printed circuit board according to claim 9, wherein the printed circuit board has a plurality of the openings formed along the longitudinal direction of the receiving port of the connector.

12. The printed circuit board according to claim 11, wherein the plurality of the openings are of the same size.

13. The printed circuit board according to claim 9, wherein the opening is a cutout formed at the end of the printed circuit board facing the receiving port of the connector.

14. The printed circuit board according to claim 9, wherein the opening is different from an opening through which a pin extending from the connector passes.

15. An image forming apparatus having a printed circuit board on which a connector to connect with a flexible flat cable or a flexible printed circuit board is mounted, comprising:
    an opening that is disposed between an end of the printed circuit board and a position at which the connector is mounted,
    wherein, in a state where the flexible flat cable or the flexible printed circuit board is connected to the connector, when viewed from a direction perpendicular to the printed circuit board, the opening is disposed at a position corresponding to a position on a second line indicating an end of the flexible flat cable or the flexible printed circuit board, the second line crossing a first line indicating the end of the printed circuit board.

16. An image forming apparatus having a printed circuit board on which a connector to connect with a flexible flat cable or a flexible printed circuit board is mounted, comprising:
    a connection portion through which the connector is connected to the printed circuit board;
    a receiving port at which the connector receives the flexible flat cable or the flexible printed circuit board, the receiving port being disposed closer to an end portion of the printed circuit board than the connection portion is, and
    an opening disposed at a position corresponding to a position of the receiving port on the printed circuit board, the opening disposed closer to the end of the printed circuit board than the connection portion is.

* * * * *